US012652982B2

(12) United States Patent
Kim et al.

(10) Patent No.: US 12,652,982 B2
(45) Date of Patent: Jun. 9, 2026

(54) SEMICONDUCTOR MANUFACTURING EQUIPMENT AND METHOD OF EXPELLING RESIDUE THROUGH SUCTION HOOD

(71) Applicant: STATS ChipPAC Pte. Ltd., Singapore (SG)

(72) Inventors: ChangOh Kim, Incheon (KR); JinHee Jung, Incheon (KR); YuJeong Jang, Incheon (KR); JiWon Lee, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 344 days.

(21) Appl. No.: 17/647,040

(22) Filed: Jan. 5, 2022

(65) Prior Publication Data

US 2023/0215721 A1     Jul. 6, 2023

(51) Int. Cl.
| | |
|---|---|
| *H01L 21/02* | (2006.01) |
| *B08B 5/02* | (2006.01) |
| *B08B 5/04* | (2006.01) |
| *B08B 15/02* | (2006.01) |
| *H01L 21/67* | (2006.01) |

(Continued)

(52) U.S. Cl.
CPC ................ *H10P 70/20* (2026.01); *B08B 5/02* (2013.01); *B08B 5/04* (2013.01); *B08B 15/02* (2013.01); *H10P 72/0406* (2026.01)

(58) Field of Classification Search
CPC ......... H01L 21/02057; H01L 21/67028; B08B 5/02; B08B 5/04; B08B 15/02
See application file for complete search history.

(56) References Cited

U.S. PATENT DOCUMENTS

| | | | |
|---|---|---|---|
| 7,326,878 B2 * | 2/2008 | Odanaka ................ | B23K 26/16 |
| | | | 219/121.84 |
| 7,913,351 B2 * | 3/2011 | Moriya .............. | A46B 15/0053 |
| | | | 15/345 |

(Continued)

FOREIGN PATENT DOCUMENTS

| | | | |
|---|---|---|---|
| KR | 20060079482 A | * | 7/2006 |
| KR | 20160052433 A | * | 5/2016 |

(Continued)

OTHER PUBLICATIONS

KR-20060079482-A—English Machine Translation (Year: 2006).*

*Primary Examiner* — Marc Carlson
(74) *Attorney, Agent, or Firm* — Robert D. Atkins; PATENT LAW GROUP

(57) ABSTRACT

A semiconductor manufacturing equipment has a support platform and a substrate disposed over the support platform. A first electrical component is disposed over a first surface of the substrate. A second electrical component is disposed over a second surface of the substrate opposite the first surface of the substrate. A suction hood is disposed over the substrate. A gas is introduced over the substrate to circulate residue while drawing the residue vertically into the suction hood. The gas can be introduced with a gas nozzle or air knife. The gas can be introduced from a gas conduit disposed at least partially around the substrate. The gas conduit can extend completely around the substrate. The gas nozzles are sequentially placed around the gas conduit. The gas can be a stable or inert gas. The residue is displaced away from the second electrical component.

31 Claims, 8 Drawing Sheets

(51) Int. Cl.
    *H10P 70/00*        (2026.01)
    *H10P 72/00*        (2026.01)

(56)           References Cited

U.S. PATENT DOCUMENTS

| | | | | |
|---|---|---|---|---|
| 9,421,643 | B2 * | 8/2016 | Endo | B23K 26/364 |
| 10,016,868 | B2 * | 7/2018 | Sheldon | B27C 5/00 |
| 2002/0092121 | A1 * | 7/2002 | Momonoi | B08B 7/0035 |
| | | | | 15/345 |
| 2011/0214246 | A1 * | 9/2011 | Marshall | B08B 7/02 |
| | | | | 15/345 |
| 2012/0079672 | A1 * | 4/2012 | Cho | H01L 21/67028 |
| | | | | 15/345 |
| 2013/0174873 | A1 * | 7/2013 | Yoshihara | B08B 5/02 |
| | | | | 134/21 |
| 2014/0007372 | A1 * | 1/2014 | Cheng | B08B 15/04 |
| | | | | 15/345 |
| 2014/0305918 | A1 * | 10/2014 | Endo | B23K 26/142 |
| | | | | 219/121.84 |
| 2015/0194325 | A1 * | 7/2015 | Yang | H01L 21/67028 |
| | | | | 15/301 |
| 2017/0106471 | A1 * | 4/2017 | Yoshii | B23K 26/147 |

FOREIGN PATENT DOCUMENTS

| | | | | |
|---|---|---|---|---|
| KR | 102104137 | B1 | 4/2020 | |
| WO | WO-2011039972 | A1 * | 4/2011 | B08B 5/04 |

* cited by examiner

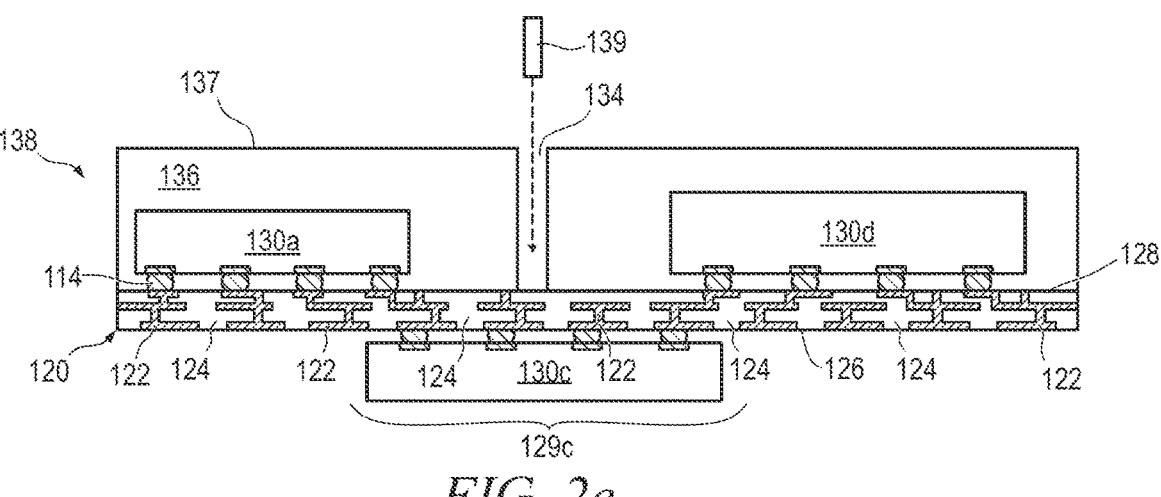
*FIG. 2e*
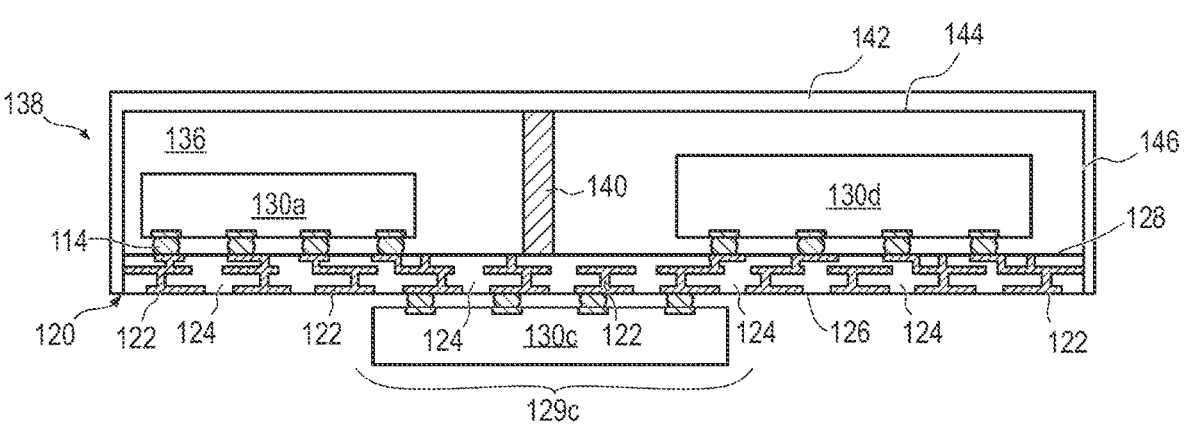
*FIG. 2f*
*FIG. 2g*

SEMICONDUCTOR MANUFACTURING EQUIPMENT AND METHOD OF EXPELLING RESIDUE THROUGH SUCTION HOOD

FIELD OF THE INVENTION

The present invention relates in general to semiconductor devices and, more particularly, to semiconductor manufacturing equipment and method of using a gas nozzle to expel residue through a suction hood.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are mounted to a substrate for structural support and electrical interconnect. An encapsulant is deposited over the semiconductor die, IPDs, and substrate. An electromagnetic shielding layer is commonly formed over the encapsulant.

The SIP module includes high speed digital and RF electrical components, highly integrated for small size and low height, and operating at high clock frequencies. The electromagnetic shielding layer reduces or inhibits EMI, RFI, and other inter-device interference, for example as radiated by high-speed digital devices, from affecting neighboring devices within or adjacent to SIP module. However, a conformally applied electromagnetic shielding layer by itself may not be effective against EMI loop currents within the shielding material. The EMI current loops can originate from high energy/output devices, such as a power amplifier embodied in one or more of the electrical components. The EMI loop currents flow through the electromagnetic shielding layer and induce EMI, RFI, and other inter-device interference in sensitive neighboring components within or adjacent to the SIP module.

To neutralize or block these EMI loop currents, a slot or channel or trench is formed in the electromagnetic shielding layer using laser cutting or laser direct ablation (LDA). To form the slot, the SIP module is placed on a working stage or support platform. A vacuum is drawn through a vacuum line in the support platform to hold the SIP module in place during the laser cutting process to form the slot. Pad marking foreign materials, dust, or processing residue may be produced from the laser cutting process. Unfortunately, the vacuum drawn through the vacuum line pulls a portion of the residue to the bottom of the SIP module where an exposed lower electrical component can be located. The residue can cause defects and failure of the lower electrical component.

BRIEF DESCRIPTION OF THE DRAWINGS

FIGS. 2a-2k illustrate a process of disposing electrical components over an interconnect substrate to form an SIP module with a slotted electromagnetic shielding layer;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
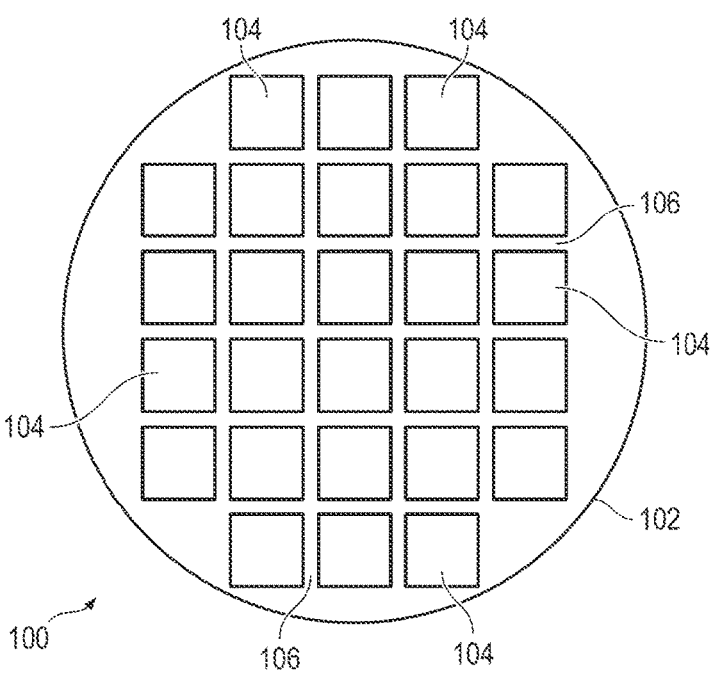
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
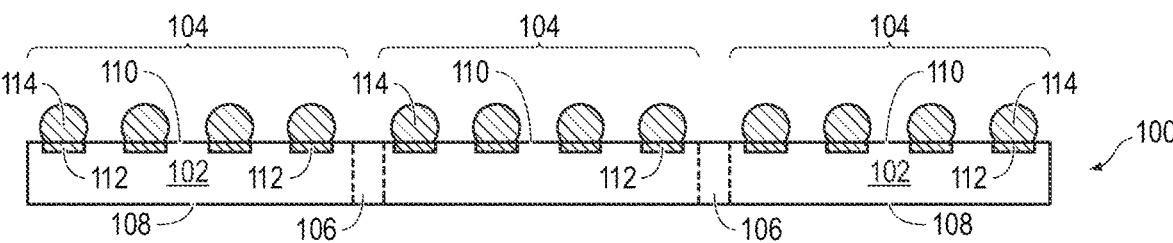

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
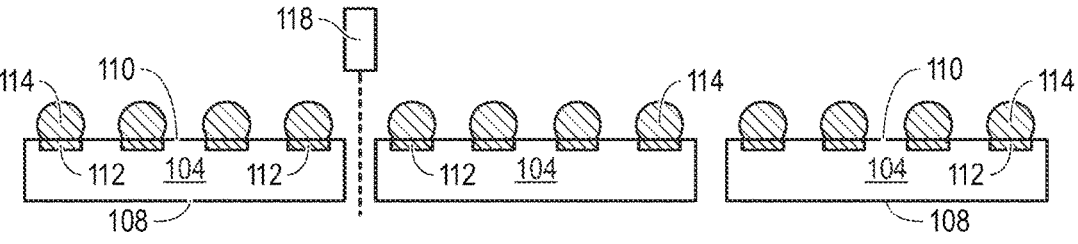

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figures 2A, 2B, 2C, 2D:
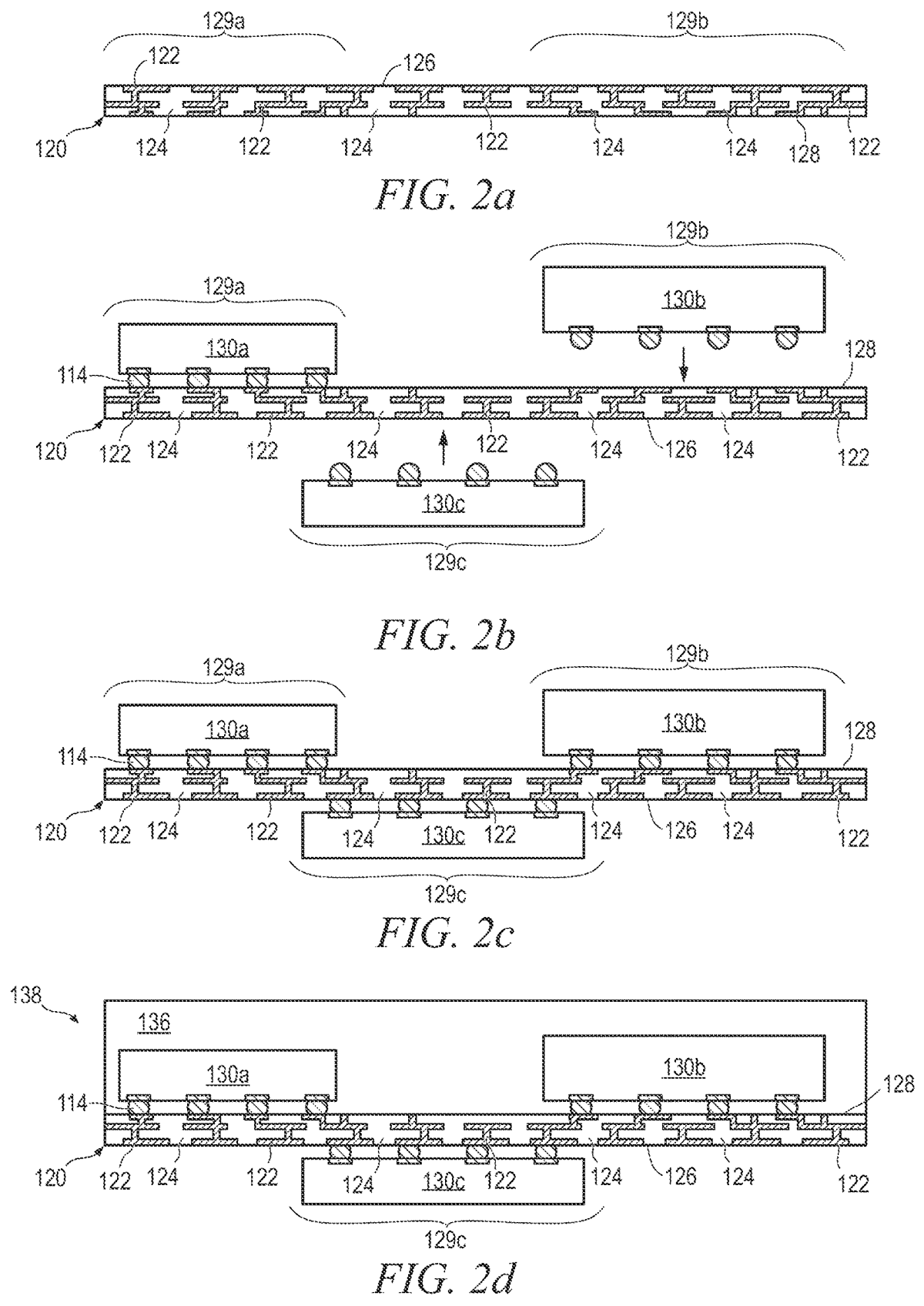
Figure 2H:
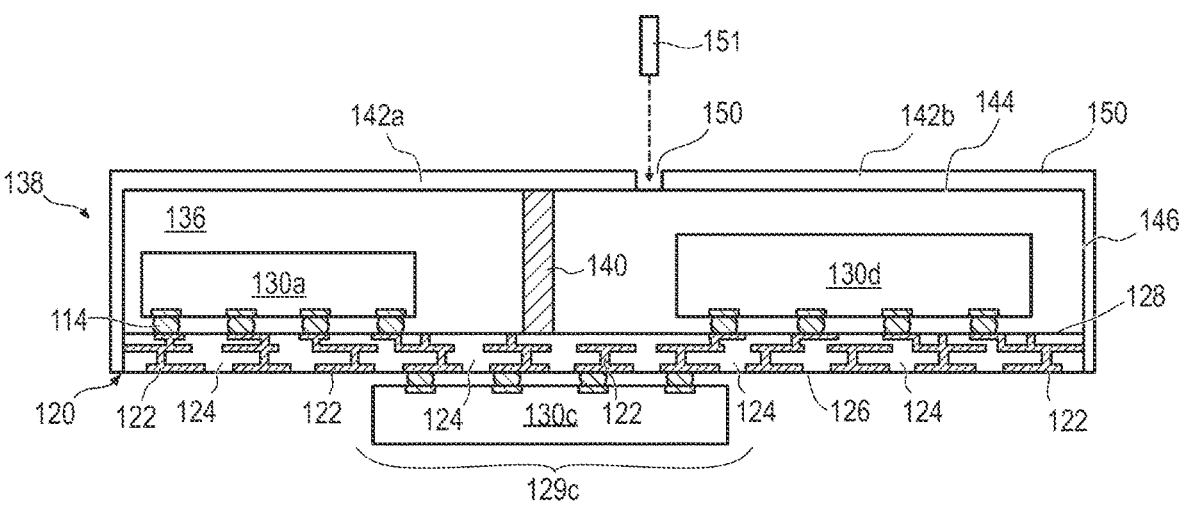

FIGS. 2a-2k illustrate a process of disposing electrical components over an interconnect substrate to form an SIP module with a slotted electromagnetic shielding layer. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

In FIG. 2b, a plurality of electrical components 130a-130c is mounted to surface 126 and surface 128 of interconnect substrate 120 and electrically and mechanically connected to conductive layers 122. Electrical components 130a-130c are each positioned over substrate 120 using a pick and place operation. For example, electrical component 130a and 130b can be similar to semiconductor die 104 from FIG. 1c, each possibly having a different form and function, with active surface 110 and bumps 114 oriented toward surface 126 of substrate 120 over component attach areas 129a and 129b. Electrical component 130c can be similar to semiconductor die 104 although possibly with a different form and function with active surface 110 and bumps 114 oriented toward surface 128 of substrate 120 over component attach area 129c. Alternatively, electrical components 130a-130c can include other semiconductor die, semiconductor packages, surface mount devices, power amplifier, discrete electrical devices, or IPDs, such as a resistor, capacitor, and inductor. FIG. 2c illustrates electrical components 130a-130c electrically and mechanically connected to conductive layers 122 of substrate 120.

In FIG. 2d, an encapsulant or molding compound 136 is deposited over and around components on substrate 100 using a paste printing, compressive molding, transfer molding, liquid encapsulant molding, vacuum lamination, spin coating, or other suitable applicator. Encapsulant 136 can be polymer composite material, such as epoxy resin with filler, epoxy acrylate with filler, or polymer with proper filler. Encapsulant 136 is non-conductive, provides structural support, and environmentally protects the semiconductor device from external elements and contaminants. Notably electrical component 130c remains an exposed semiconductor device on surface 128 of interconnect substrate 120. Electrical components 130a-130c, as mounted to interconnect substrate 120 and covered by encapsulant 136 (at least for 130a-130b), constitute SIP module 138.

In FIG. 2e, a plurality of vias 134 is formed into surface 137 of encapsulant 136 using etching, drilling, or laser direct ablation (LDA) with laser 139. Vias 134 are aligned with and extend to portions of conductive layer 122 on interconnect substrate 120. In FIG. 2f, vias 134 are filled with Al, Cu, Sn, Ni, Au, Ag, Ti, W, poly-silicon, or other suitable electrically conductive material using paste printing and reflow, electrolytic plating, electroless plating process, or other suitable metal deposition process to form z-direction vertical conductive posts 140. Conductive posts 140 are electrically connected to conductive layer 122. Conductive posts 140 can be formed over conductive layer 122 of substrate 120 prior to encapsulant 136. In this case, encapsulant 136 would be deposited over conductive posts 140.

Electrical components 130a-130b may contain IPDs that are susceptible to or generate EMI, RFI, harmonic distortion, and inter-device interference. For example, the IPDs contained within electrical components 130a-130b provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130b contain digital circuits switching at a high frequency, which could interfere with the operation of IPDs in the SIP module.

In FIG. 2g, electromagnetic shielding layer 142 is formed or disposed over surface 144 of encapsulant 136 by conformal application of shielding material. Shielding layer 142 can be one or more layers of Al, Cu, Sn, Ni, Au, Ag, or other suitable conductive material. Alternatively, shielding layer 142 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 142 covers side surfaces 146 of encapsulant 136, as well as the side surface of substrate 120.

SIP module 138 includes high speed digital and RF electrical components 130a-130b, highly integrated for small size and low height, and operating at high clock frequencies. Electromagnetic shielding layer 142 reduces or inhibits EMI, RFI, and other inter-device interference, for example as radiated by high-speed digital devices, from affecting neighboring devices within or adjacent to SIP module 138. However, a conformally applied electromagnetic shielding layer 142 by itself may not be effective against EMI loop currents within the shielding material. The EMI current loops can originate from high energy/output devices, such as a power amplifier embodied in one or more of electrical components 130a-130b. The EMI loop currents flow through electromagnetic shielding layer 142 and induce EMI, RFI, and other inter-device interference in sensitive neighboring components within or adjacent to SIP module 138.

Figure 2I:
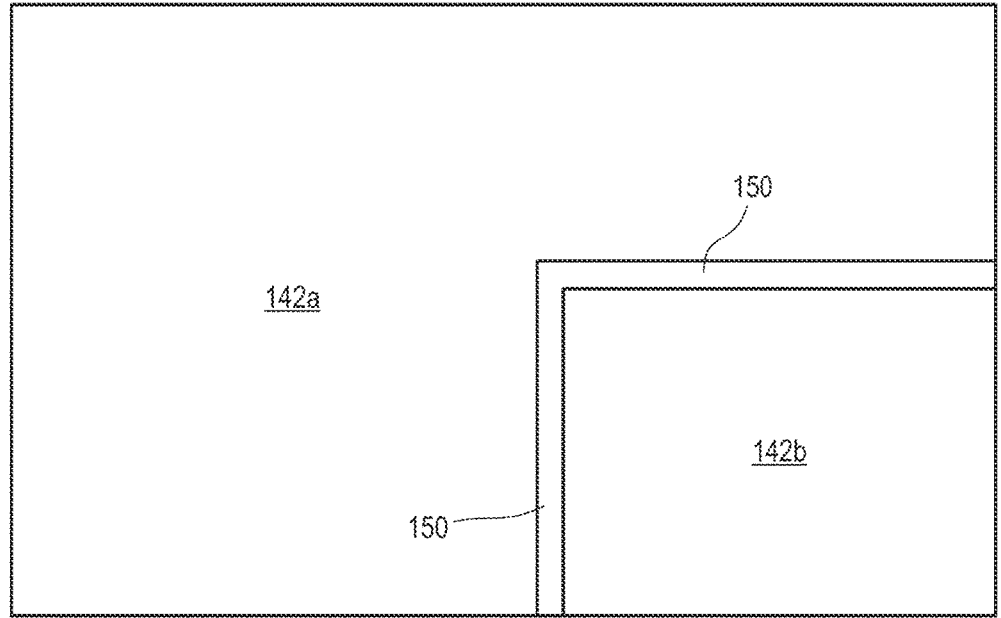

To neutralize or block these EMI loop currents, slot or channel or trench 150 is formed in electromagnetic shielding layer 142 using laser cutting or laser direct ablation (LDA) with laser 151, as shown in FIG. 2h. Slot 150 cuts completely through electromagnetic shielding layer 142 to encapsulant 136. That is, slot 150 extends at least to encapsulant 136 or extends partially into the encapsulant to cut completely through electromagnetic shielding layer 142. FIG. 2i is a top view of SIP module 138 with slot 150 formed to electrically isolate main body portion 142a from corner portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SIP module 138.

Figure 2J:
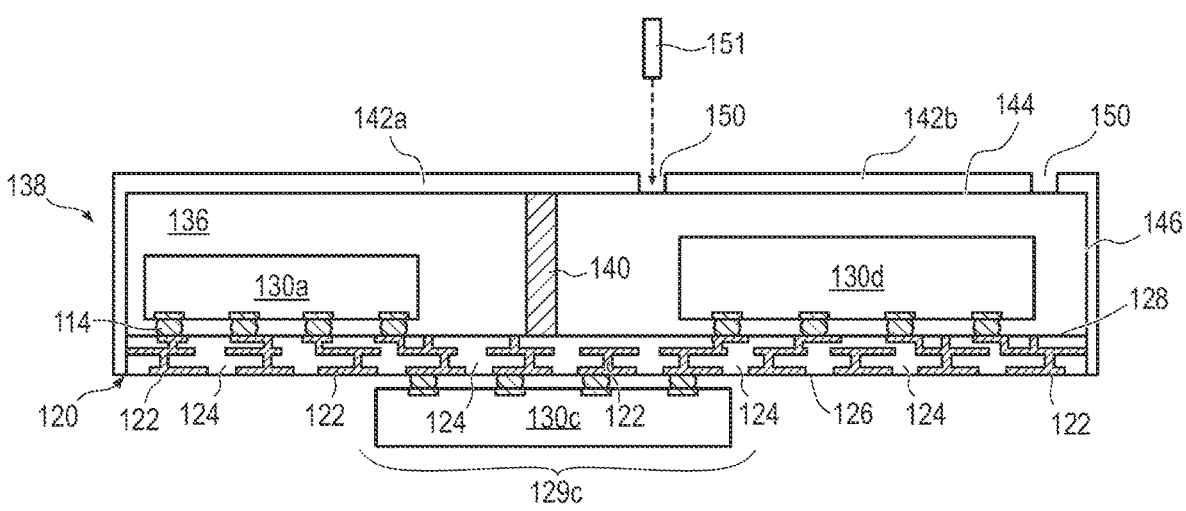
Figure 2K:
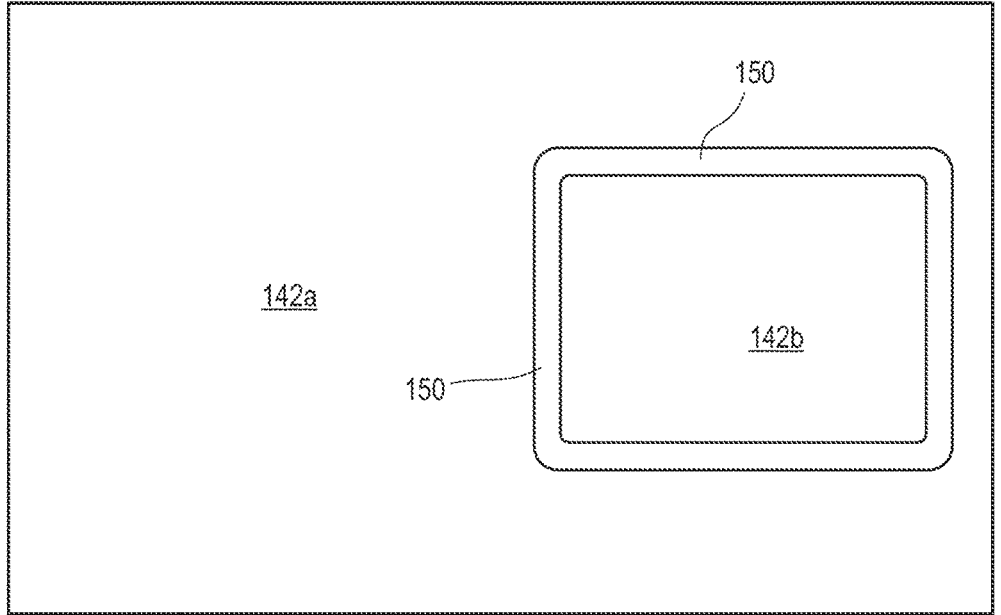

In another embodiment, slot or channel or trench 150 is formed as a continuous loop in electromagnetic shielding layer 142 using laser cutting or LDA with laser 151, as shown in FIG. 2j. Slot 150 cuts completely through electromagnetic shielding layer 142 to encapsulant 136. That is, slot 150 extends at least to encapsulant 136 or extends partially into the encapsulant to cut completely through electromagnetic shielding layer 142. FIG. 2k is a top view of SIP module 138 with slot 150 formed to electrically isolate main body portion 142a from interior island portion 142b of electromagnetic shielding layer 142. Slot 150 creates an electrical open or disjunction between shielding portion 142a of electromagnetic shielding layer 142 and shielding portion 142b. EMI loop currents cannot flow across slot 150 between shielding portion 142a and shielding portion 142b, or vice versa. There is no conduction path between the shielding portion 142a and shielding portion 142b. Slot 150 provides an additional layer of protection by electrically isolating shielding portion 142a from shielding portion 142b to reduce or inhibit EMI, RFI, and other inter-device interference in sensitive neighboring components within or adjacent to SIP module 138.

Figure 3A:
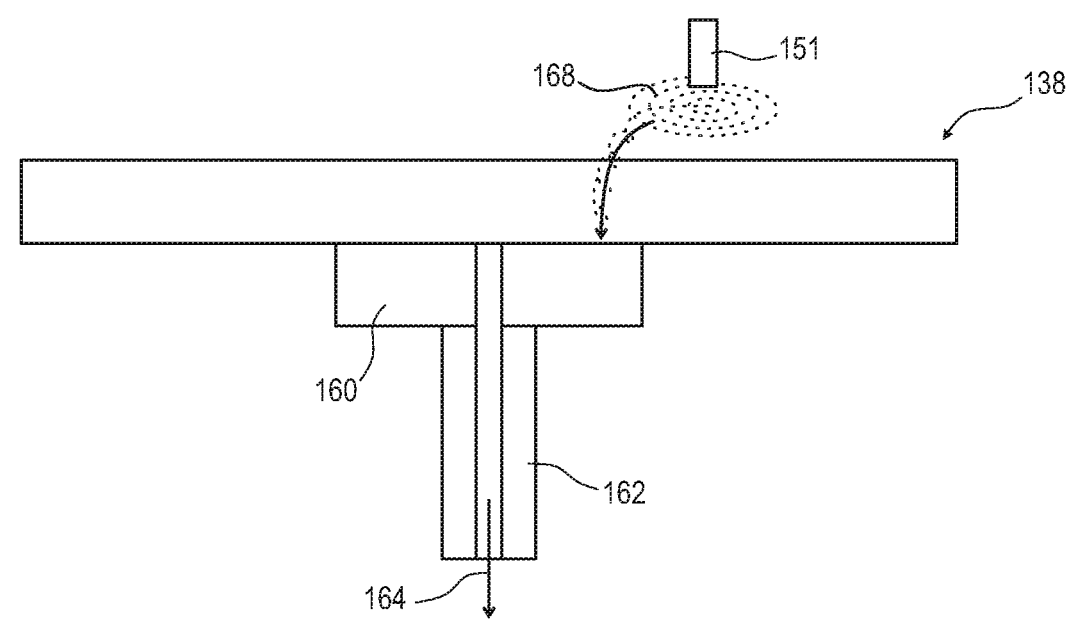
FIGS. 3a-3d illustrate a process of expelling residue through a suction hood using a gas nozzle.

To form slot 150, SIP module 138 is placed on working stage or support platform 160 supported by pedestal 162, as shown in FIG. 3a. A vacuum is drawn through vacuum line 164 to hold SIP module 138 in place during the laser cutting process to form slot 150. Pad marking foreign materials, dust, or processing residue 168 may be produced from the laser cutting process. Unfortunately, the vacuum drawn through vacuum line 164 pulls a portion of residue 168 to the bottom of SIP module 138 where the exposed electrical component 130c is located. Residue 168 can cause defects and failure of electrical component 130c. Accordingly, electrical component 130c should be isolated as much as possible from residue 168 during or after the formation of slot 150.

Figure 3B:
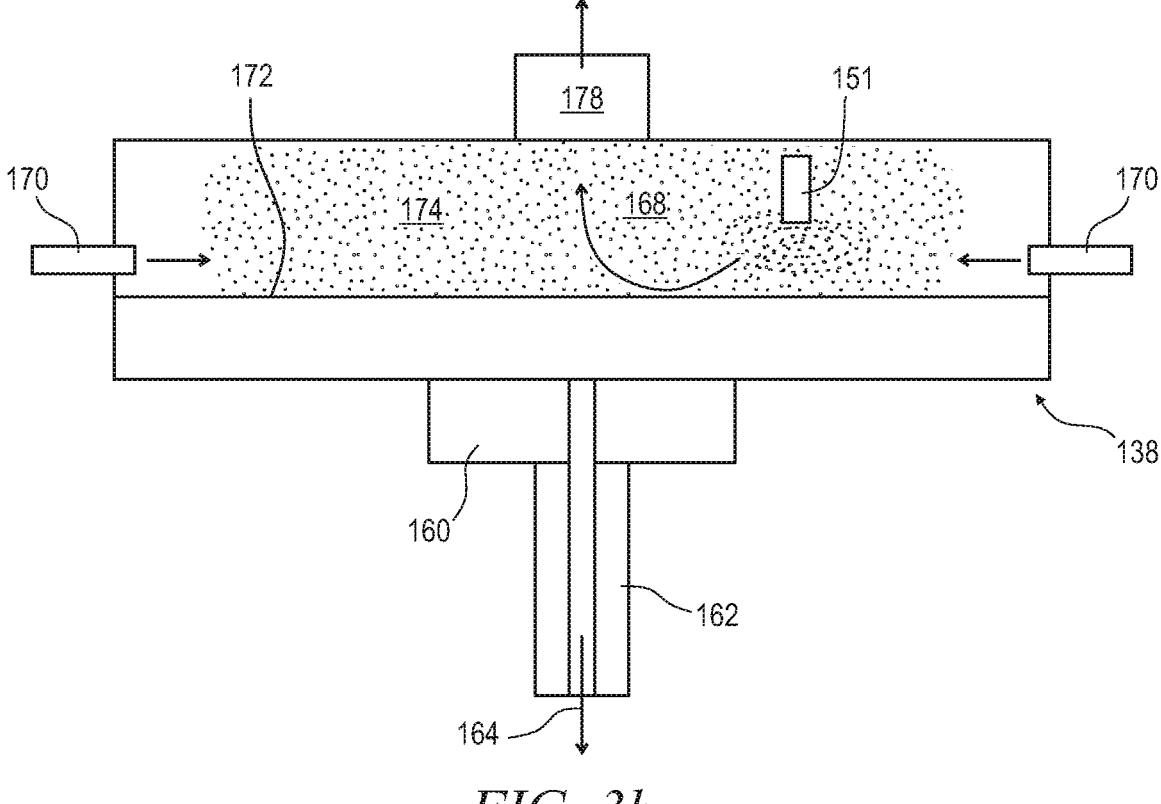
Figure 3C:
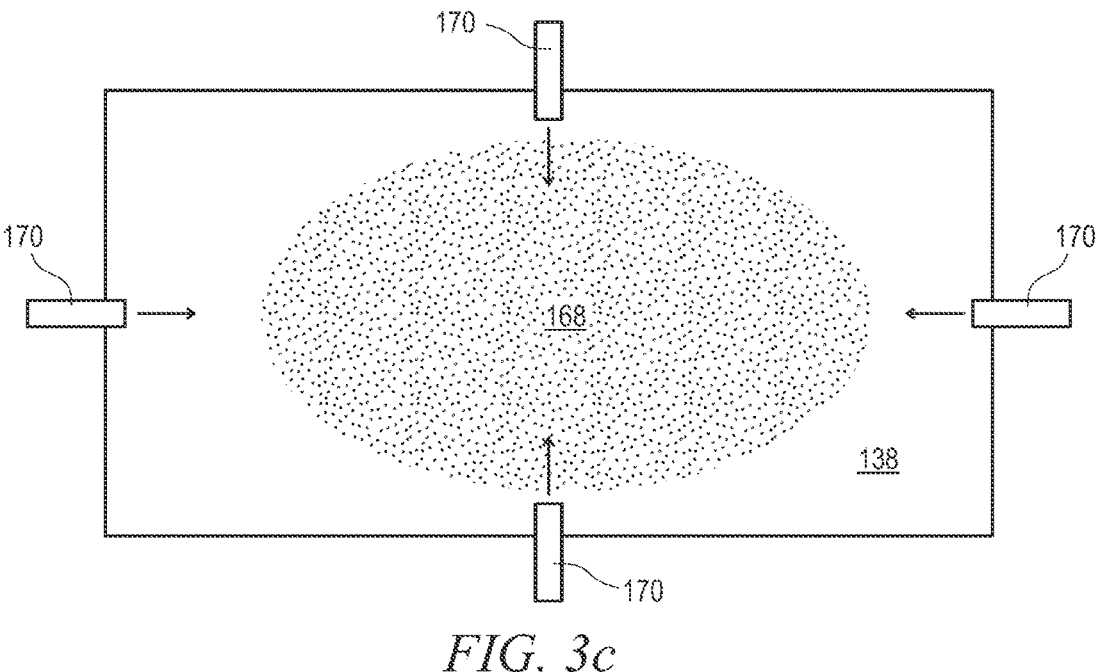

In FIG. 3b, a plurality of air or gas nozzles or air knife ports 170 are directed to surface 172 of SIP module 138. Suction hood 174 is disposed over surface 172 of SIP module 138. Gas flow from gas nozzles 170 blows across surface 172 during and after the laser cutting process to form slot 150. The gas can be a stable or inert gas such as nitrogen. Gas flow injected into suction hood 174 from gas nozzles 170 creates air currents to keep residue 168 circulating within the suction hood. Hood exhaust 178 draws negative pressure within suction hood 174 to overcome the downward draw from the vacuum so that a substantial portion of residue 168 is expelled or forced up through hood exhaust 178, instead of reaching to the bottom of SIP module 138 where the exposed electrical component 130c is located. The combination of gas flow across surface 172 and negative pressure within suction hood 174 displaces residue 168 away from electrical component 130c. FIG. 3c is a top view of SIP module 138 with air nozzles 170 position on each side of the SIP module. Air nozzles 170 can be directed in terms of angle, direction, and flow rate to expel or force residue 168 up hood exhaust 178 and reduce or prevent accumulation of the residue on the exposed electrical component 130c, as well as electrical interconnect pads and bumps.

Figure 3D:
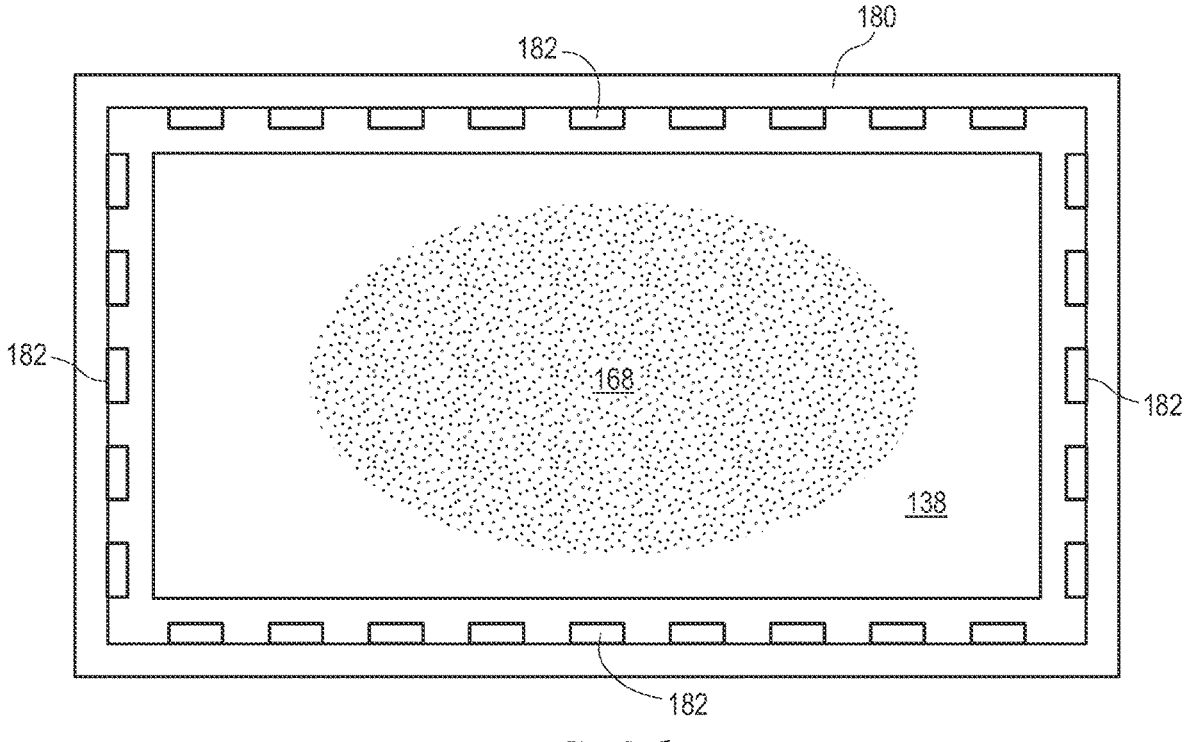

In another embodiment, gas conduit 180 is disposed completely around SIP module 138, as shown in FIG. 3d. Gas conduit 180 includes air or gas nozzles or air knife 182 on each side of SIP module 138. Gas nozzles 182 are sequentially placed around gas conduit 180. Gas conduit 180 can be disposed partially around SIP module 138. Gas flow from gas nozzles 182 blows across surface 172 during and after the laser cutting process to form slot 150. The gas can be a stable or inert gas such as nitrogen. Gas flow from gas nozzles 182 creates gas currents to keep residue 168 circulating within suction hood 174. Hood exhaust 178 draws negative pressure within suction hood 174 to overcome the downward draw from the vacuum so that a substantial portion of residue 168 is expelled or forced up through hood exhaust 178, instead of reaching to the bottom of SIP module 138 where the exposed electrical component 130c is located. Gas conduit 180 with gas nozzles 182 reduce or prevent accumulation of residue 168 on the exposed electrical component 130c, as well as electrical interconnect pads and bumps.

Figure 4:
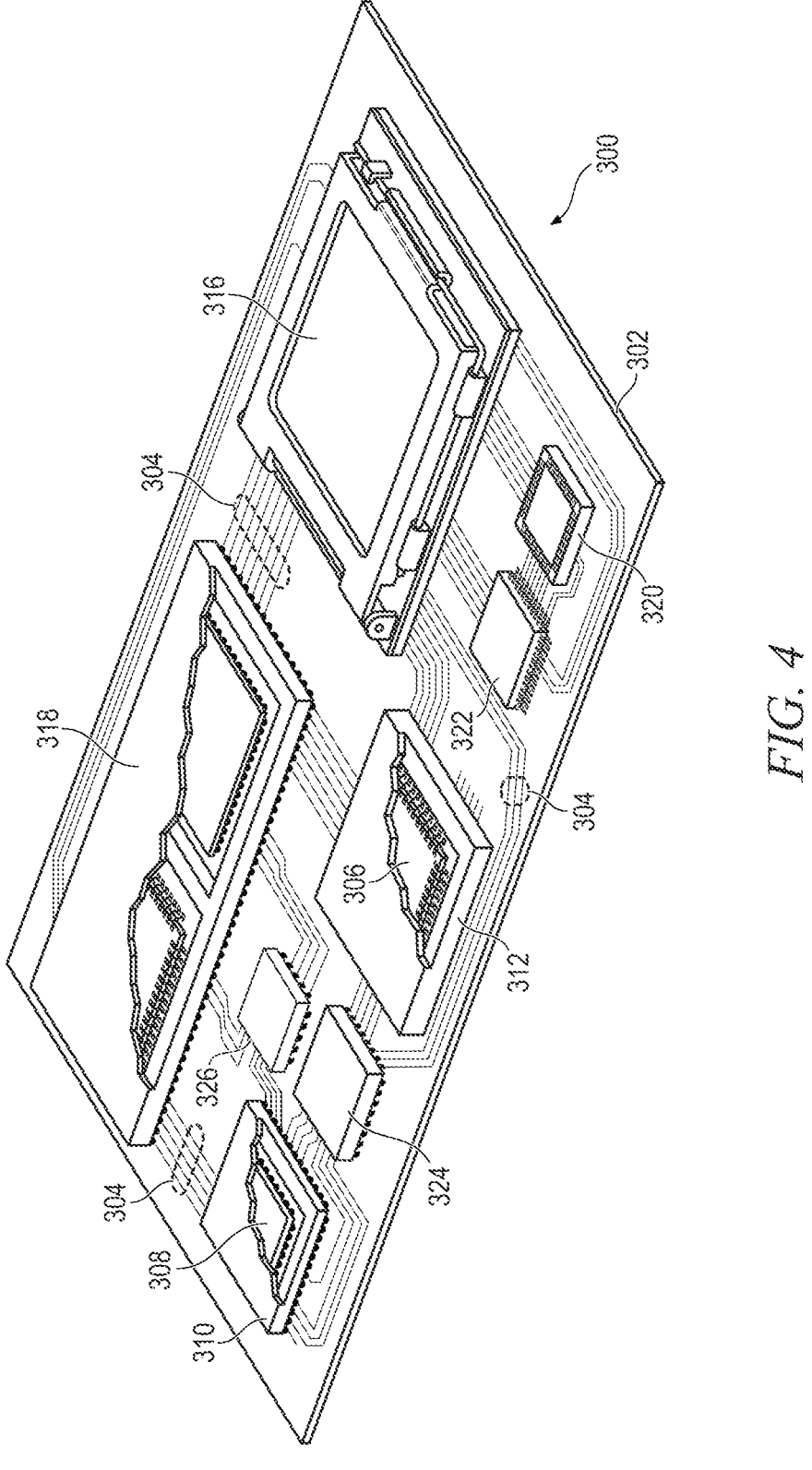
FIG. 4 illustrates a printed circuit board (PCB) with different types of packages mounted to a surface of the PCB.

FIG. 4 illustrates electronic device 300 having a chip carrier substrate or PCB 302 with a plurality of semiconductor packages mounted on a surface of PCB 302, including SIP module 138. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 4, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a support platform including a vacuum line adapted to draw a vacuum;
   disposing a substrate over the support platform and held in place by the vacuum;
   disposing a suction hood over the substrate with an exhaust of the suction hood disposed above a central area of the suction hood, wherein the suction hood contacts a surface of the substrate to impose a negative pressure within the suction hood to overcome the vacuum drawn from the vacuum line and draw residue from all areas of the suction hood into the exhaust; and
   disposing a plurality of gas nozzles at locations around the suction hood to inject a gas from multiple locations around the substrate and maintain circulation of residue from the substrate within the suction hood while drawing the residue vertically from the negative pressure into the exhaust of the suction hood from all areas of the suction hood.

2. The method of claim 1, further including disposing a first electrical component over a first surface of the substrate.

3. The method of claim 2, further including disposing a second electrical component over a second surface of the substrate opposite the first surface of the substrate, wherein the residue is displaced away from the second electrical component.

4. The method of claim 1, wherein the gas includes a stable or inert gas.

5. The method of claim 1, further including injecting the gas from a gas nozzle or air knife.

6. The method of claim 1, further including injecting the gas from a gas conduit disposed at least partially around the substrate.

7. A method of making a semiconductor device, comprising:
   providing a support platform including a vacuum line adapted to draw a vacuum;
   disposing a substrate over the support platform and held in place by the vacuum;
   disposing a suction hood over the substrate with an exhaust of the suction hood disposed above a central area of the suction hood to impose a negative pressure within the suction hood to overcome the vacuum drawn from the vacuum line and draw residue from throughout the suction hood into the exhaust; and
   introducing a gas over the substrate to maintain circulation of residue within the suction hood while drawing the residue vertically from the negative pressure into the exhaust of the suction hood from throughout the suction hood.

8. The method of claim 7, further including disposing a first electrical component over a first surface of the substrate.

9. The method of claim 8, further including disposing a second electrical component over a second surface of the substrate opposite the first surface of the substrate, wherein the residue is displaced away from the second electrical component.

10. The method of claim 7, further including disposing the substrate over a support platform.

11. The method of claim 7, wherein the gas includes a stable or inert gas.

12. The method of claim 7, further including introducing the gas from a gas nozzle or air knife.

13. The method of claim 7, further including introducing the gas from a gas conduit disposed at least partially around the substrate.

14. A semiconductor manufacturing equipment, comprising:
    a support platform including a vacuum line adapted to draw a vacuum;
    a substrate disposed over the support platform and held in place by the vacuum;
    a suction hood disposed over the substrate with an exhaust of the suction hood disposed above a central area of the suction hood, wherein the suction hood contacts a surface of the substrate to impose a negative pressure within the suction hood to overcome the vacuum drawn from the vacuum line and draw residue from all areas of the suction hood into the exhaust; and
    a plurality of gas nozzles disposed at locations around the suction hood to inject a gas from multiple locations around the substrate and maintain circulation of the residue from the substrate within the suction hood while drawing the residue vertically from the negative pressure into the exhaust of the suction hood from all areas of the suction hood.

15. The semiconductor manufacturing equipment of claim 14, further including a first electrical component disposed over a first surface of the substrate.

16. The semiconductor manufacturing equipment of claim 15, further including a second electrical component disposed over a second surface of the substrate opposite the first surface of the substrate, wherein the residue is displaced away from the second electrical component.

17. The semiconductor manufacturing equipment of claim 14, wherein the gas includes a stable or inert gas.

18. The semiconductor manufacturing equipment of claim 14, further including a gas conduit including the gas nozzle disposed at least partially around the substrate.

19. The semiconductor manufacturing equipment of claim 14, further including a gas conduit including the gas nozzle disposed completely around the substrate.

20. A semiconductor manufacturing equipment, comprising:
    a support platform including a vacuum line adapted to draw a vacuum;
    a substrate disposed over the support platform and held in place by the vacuum;
    a suction hood disposed over the substrate with an exhaust of the suction hood disposed above a central area of the suction hood to impose a negative pressure within the suction hood to overcome the vacuum drawn from the vacuum line and draw residue from throughout the suction hood into the exhaust; and
    a plurality of gas nozzles disposed at locations around the suction hood to introduce a gas over the substrate and maintain circulation of residue within the suction hood while drawing the residue vertically from the negative pressure into the exhaust of the suction hood from throughout the suction hood.

21. The semiconductor manufacturing equipment of claim 20, further including a first electrical component disposed over a first surface of the substrate.

22. The semiconductor manufacturing equipment of claim 21, further including a second electrical component disposed over a second surface of the substrate opposite the first surface of the substrate, wherein the residue is displaced away from the second electrical component.

23. The semiconductor manufacturing equipment of claim 20, wherein the suction hood contacts a surface of the substrate to impose the negative pressure within the suction hood to overcome the vacuum drawn from the vacuum line and draw the residue from throughout the suction hood into the exhaust and maintain circulation of the residue within the suction hood while drawing the residue vertically from the negative pressure into the exhaust from throughout the suction hood.

24. The semiconductor manufacturing equipment of claim 20, wherein the gas includes a stable or inert gas.

25. The semiconductor manufacturing equipment of claim 20, further including a gas conduit including the gas nozzle for introducing the gas, wherein the gas conduit is disposed at least partially around the substrate.

26. A semiconductor manufacturing equipment, comprising:
    a support platform including a vacuum line adapted to draw a vacuum;
    a substrate disposed over the support platform and held in place by the vacuum;
    a suction hood disposed over the substrate with an exhaust of the suction hood disposed above a central area of the suction hood to impose a negative pressure within the suction hood to overcome the vacuum drawn from the vacuum line and draw residue from throughout the suction hood into the exhaust; and
    a gas nozzle introducing a gas over the substrate to maintain circulation of residue from the substrate within the suction hood while drawing the residue into the exhaust of the suction hood from throughout the suction hood.

27. The semiconductor manufacturing equipment of claim 26, further including a first electrical component disposed over a first surface of the substrate.

28. The semiconductor manufacturing equipment of claim 27, further including a second electrical component disposed over a second surface of the substrate opposite the first surface of the substrate, wherein the residue is displaced away from the second electrical component.

29. The semiconductor manufacturing equipment of claim 26, wherein the suction hood contacts a surface of the substrate to impose the negative pressure within the suction hood to overcome the vacuum drawn from the vacuum line and draw the residue from throughout the suction hood into the exhaust and maintain circulation of the residue within the suction hood while drawing the residue vertically from the negative pressure into the exhaust from throughout the suction hood.

30. The semiconductor manufacturing equipment of claim 26, wherein the gas includes a stable or inert gas.

31. The semiconductor manufacturing equipment of claim 26, further including a gas conduit including the gas nozzle for introducing the gas, wherein the gas conduit is disposed at least partially around the substrate.

* * * * *